United States Patent
Brask et al.

(10) Patent No.: US 7,381,608 B2
(45) Date of Patent: Jun. 3, 2008

(54) METHOD FOR MAKING A SEMICONDUCTOR DEVICE WITH A HIGH-K GATE DIELECTRIC AND A METAL GATE ELECTRODE

(75) Inventors: Justin K. Brask, Portland, OR (US); Sangwoo Pae, Beaverton, OR (US); Jack Kavalieros, Portland, OR (US); Matthew V. Metz, Hillsboro, OR (US); Mark L. Doczy, Beaverton, OR (US); Suman Datta, Beaverton, OR (US); Robert S. Chau, Beaverton, OR (US); Jose A. Maiz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/006,218

(22) Filed: Dec. 7, 2004

(65) Prior Publication Data

US 2006/0121678 A1 Jun. 8, 2006

(51) Int. Cl.
*H01L 21/8238* (2006.01)

(52) U.S. Cl. ............... 438/216; 438/591; 438/792; 257/E21.202

(58) Field of Classification Search .......... 438/216, 438/591, 792, 926; 257/E21.202
See application file for complete search history.

(56) References Cited

U.S. PATENT DOCUMENTS

| 6,043,157 | A | * | 3/2000 | Gardner et al. ............ 438/692 |
| 6,063,698 | A | | 5/2000 | Tseng et al. .............. 438/585 |
| 6,093,590 | A | | 7/2000 | Lou |
| 6,184,072 | B1 | | 2/2001 | Kaushik et al. ............ 438/197 |
| 6,210,999 | B1 | | 4/2001 | Gardner et al. |
| 6,255,698 | B1 | | 7/2001 | Gardner et al. ............ 257/369 |
| 6,365,450 | B1 | | 4/2002 | Kim ............................ 438/216 |
| 6,410,376 | B1 | | 6/2002 | Ng et al. .................... 438/199 |
| 6,420,279 | B1 | | 7/2002 | Ono et al. ................... 438/785 |
| 6,475,874 | B2 | | 11/2002 | Xiang et al. ................ 438/396 |
| 6,514,828 | B2 | | 2/2003 | Ahn et al. ................... 438/240 |
| 6,544,906 | B2 | | 4/2003 | Rotondaro et al. ........ 438/785 |
| 6,586,288 | B2 | | 7/2003 | Kim et al. ................... 438/183 |
| 6,617,209 | B1 | | 9/2003 | Chau et al. ................. 438/240 |

(Continued)

FOREIGN PATENT DOCUMENTS

EP 0 899 784 A2 3/1999

(Continued)

OTHER PUBLICATIONS

Polishchuk et al., "Dual Workfunction CMOS Gate Technology Based on Metal Interdiffusion", www.eesc.berkeley.edu, 1 page, no date.

(Continued)

*Primary Examiner*—Chandra Chaudhari

(57) ABSTRACT

A method for making a semiconductor device is described. That method comprises adding nitrogen to a silicon dioxide layer to form a nitrided silicon dioxide layer on a substrate. After forming a sacrificial layer on the nitrided silicon dioxide layer, the sacrificial layer is removed to generate a trench. A high-k gate dielectric layer is formed on the nitrided silicon dioxide layer within the trench, and a metal gate electrode is formed on the high-k gate dielectric layer.

20 Claims, 5 Drawing Sheets

U.S. PATENT DOCUMENTS

| | | |
|---|---|---|
| 6,617,210 B1 | 9/2003 | Chau et al. ............... 438/240 |
| 6,620,713 B2 | 9/2003 | Arghavani et al. ......... 438/585 |
| 6,642,131 B2 | 11/2003 | Harada ..................... 438/591 |
| 6,667,246 B2 | 12/2003 | Mitsuhashi et al. ........ 438/756 |
| 6,689,675 B1 | 2/2004 | Parker et al. .............. 438/585 |
| 6,696,327 B1 | 2/2004 | Brask et al. ............... 438/197 |
| 6,696,345 B2 | 2/2004 | Chau et al. ................ 438/387 |
| 6,709,911 B1 | 3/2004 | Doczy et al. .............. 438/197 |
| 6,713,358 B1 | 3/2004 | Chau et al. ................ 438/287 |
| 6,716,707 B1 | 4/2004 | Brask et al. ............... 438/287 |
| 6,746,967 B2 | 6/2004 | Brask et al. ............... 438/752 |
| 6,770,568 B2 | 8/2004 | Brask et al. ............... 438/746 |
| 6,787,440 B2 | 9/2004 | Parker et al. .............. 438/591 |
| 6,794,234 B2 | 9/2004 | Polishchuk et al. ........ 438/199 |
| 2002/0058374 A1 | 5/2002 | Kim et al. ................. 438/228 |
| 2002/0086504 A1 | 7/2002 | Park et al. ................. 438/580 |
| 2002/0197790 A1 | 12/2002 | Kizilyalli et al. .......... 438/240 |
| 2003/0032303 A1 | 2/2003 | Yu et al. ................... 438/770 |
| 2003/0045080 A1 | 3/2003 | Visokay et al. ............ 438/591 |

FOREIGN PATENT DOCUMENTS

GB    2 358 737 A    4/2001

OTHER PUBLICATIONS

Doug Barlage et al., "High-Frequency Response of 100nm Integrated CMOS Transistors with High-K Gate Dielectrics", 2001 IEEE, 4 pages.

Lu et al., "Dual-Metal Gate Technology for Deep-Submicron CMOS Devices", dated Apr. 29, 2003, 1 page.

Schwantes et al., "Performance Improvement of Metal Gate CMOS Technologies with Gigabit Feature Sizes", Technical University of Hanburg-Harburg, 5 pages, no date.

Brask et al., "A Method for Making a Semiconductor Device that Includes a Metal Gate Electrode", U.S. Appl. No. 10/739,173, filed Dec. 18, 2003.

Brask et al., "A Method for Making a Semiconductor Device Having a High-K Gate Dielectric Layer and Metal Gate Electrode", U.S. Appl. No. 10/828,958, filed Apr. 20, 2004.

Metz et al., "A Method for Making a Semiconductor Device Having a High-K Gate Dielectric Layer and Metal Gate Electrode", U.S. Appl. No. 10/839,077, filed May 4, 2004.

Notification of Transmittal of the International Search Report and the Written Opinion of the International Searching Authority or the Declaration, International Application No. PCT/US2005/044696, Date of Mailing Jul. 26, 2006.

* cited by examiner

METHOD FOR MAKING A SEMICONDUCTOR DEVICE WITH A HIGH-K GATE DIELECTRIC AND A METAL GATE ELECTRODE

FIELD OF THE INVENTION

The present invention relates to methods for making semiconductor devices, in particular, those with high-k gate dielectrics and metal gate electrodes.

BACKGROUND OF THE INVENTION

A CMOS field-effect transistor may include a high-k gate dielectric and metal gate electrodes. The metal gate electrodes may be formed from different metals using a replacement gate process. In that process, a first polysilicon layer, bracketed by a pair of spacers, is removed to create a trench between the spacers. The trench is lined with a high-k gate dielectric layer and then filled with a first metal. After a second polysilicon layer is removed, the resulting trench is lined with a high-k gate dielectric layer and filled with a second metal that differs from the first metal. When such a process forms the high-k gate dielectric layer on a chemically treated substrate, the resulting transistor may be unreliable.

Rather than apply a replacement gate process to form a metal gate electrode on a high-k gate dielectric layer, a subtractive approach may be used. In such a process, a metal gate electrode is formed on a high-k gate dielectric layer by depositing a metal layer on the dielectric layer, masking the metal layer, and then removing the uncovered part of the metal layer and the underlying portion of the dielectric layer. Although a transistor formed using such a process may be reliable, it may not provide optimum performance.

Accordingly, there is a need for an improved process for making a semiconductor device that includes a high-k gate dielectric and a metal gate electrode. There is a need for such a process that may generate a high performance device, which is also reliable. The method of the present invention provides such a process.

Features shown in these figures are not intended to be drawn to scale.

DETAILED DESCRIPTION OF THE PRESENT INVENTION

A method for making a semiconductor device is described. That method comprises forming a silicon dioxide layer on a substrate, then adding nitrogen to that layer to form a nitrided silicon dioxide layer. After forming a sacrificial layer on the nitrided silicon dioxide layer, the sacrificial layer is removed to generate a trench. A high-k gate dielectric layer is formed on the nitrided silicon dioxide layer within the trench, and a metal gate electrode is formed on the high-k gate dielectric layer.

In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 1A:
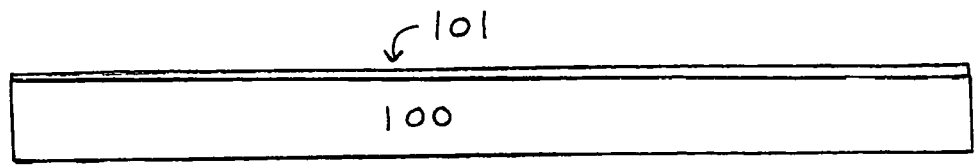
FIGS. 1a-1q represent cross-sections of structures that may be formed when carrying out an embodiment of the method of the present invention.
Figure 1B:
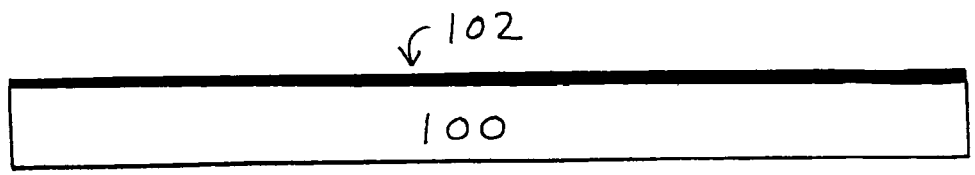
Figure 1C:
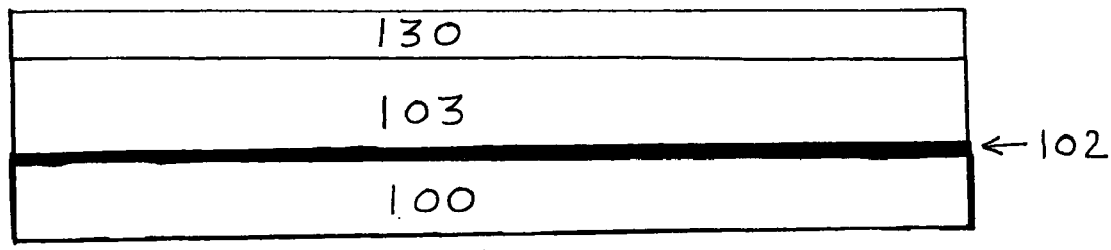
Figure 1D:
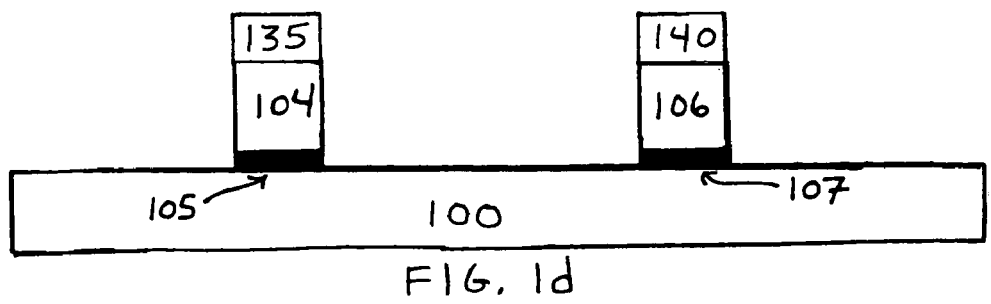
Figure 1E:
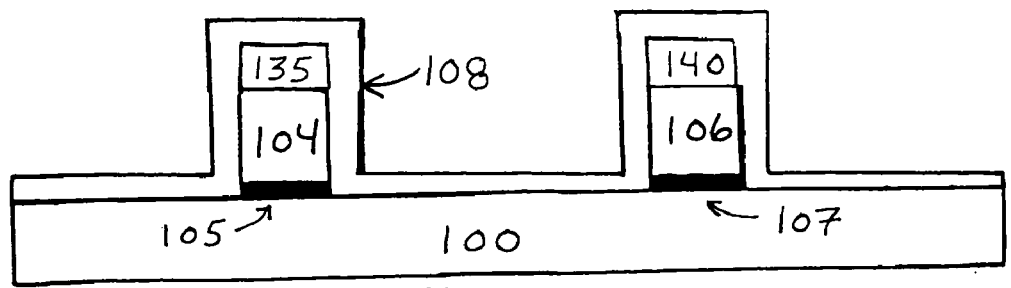
Figure 1F:
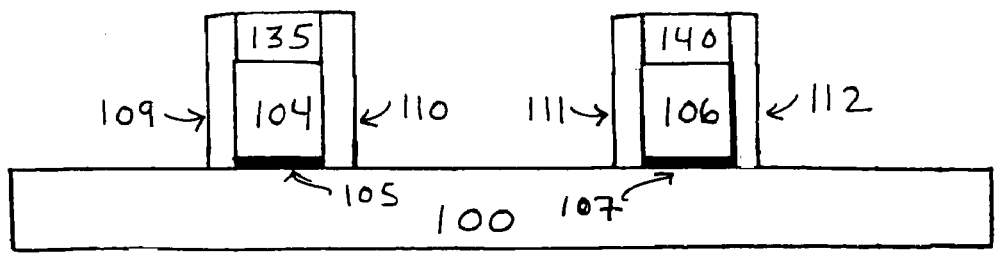
Figure 1G:
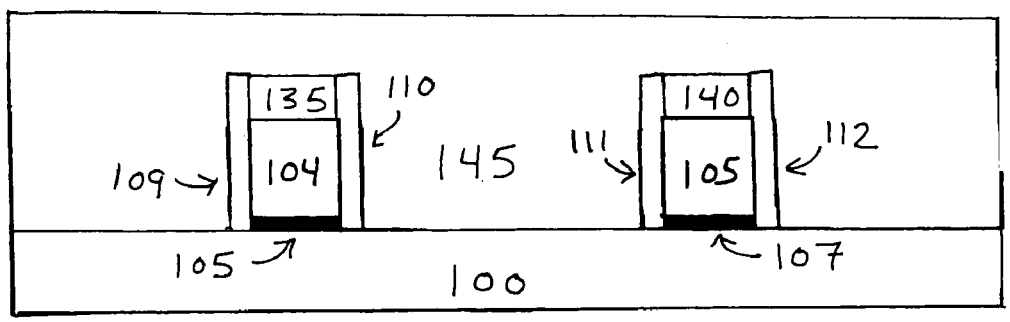
Figure 1H:
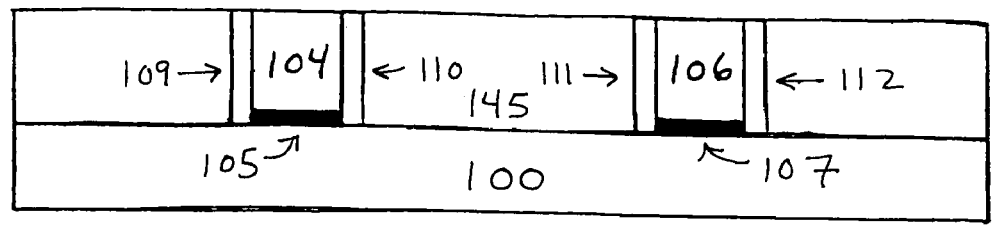
Figure 1I:
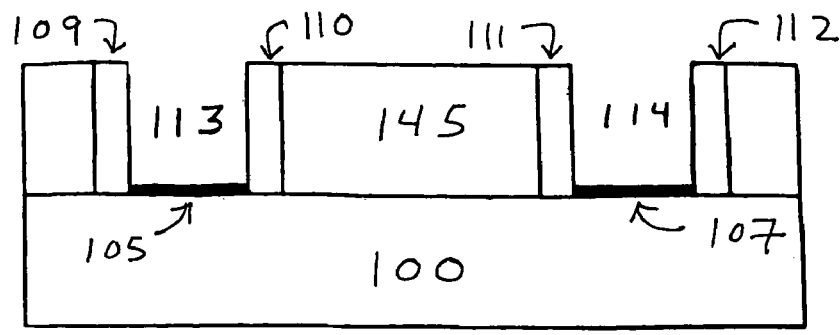
Figure 1J:
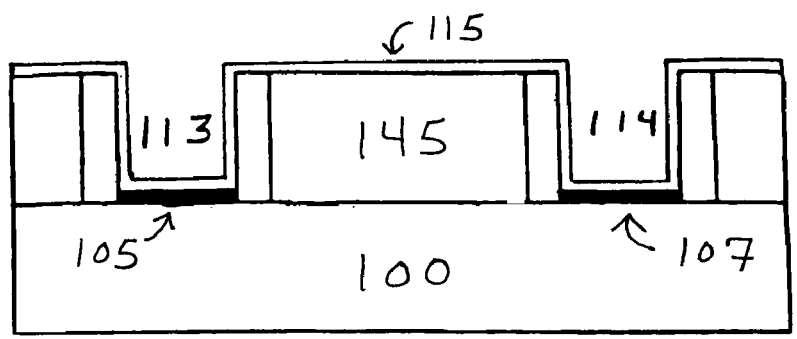
Figure 1K:
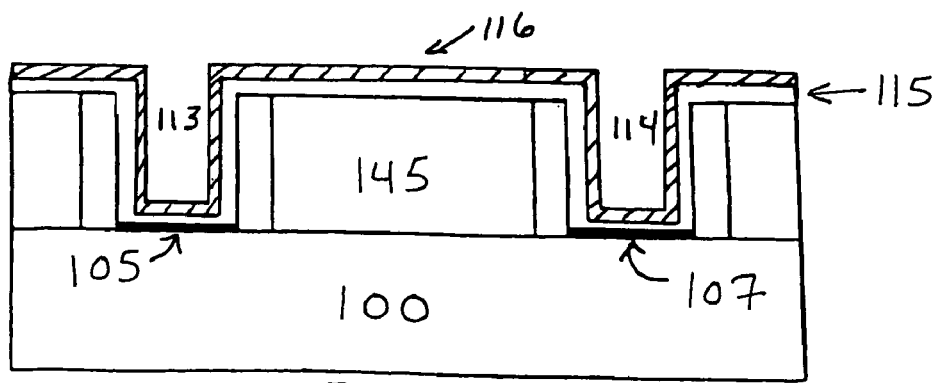
Figure 1L:
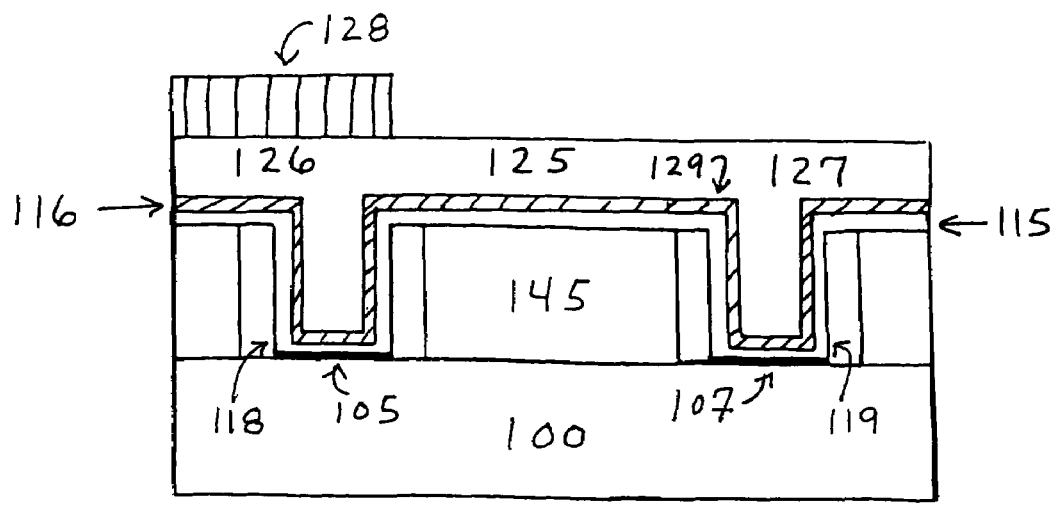
Figure 1M:
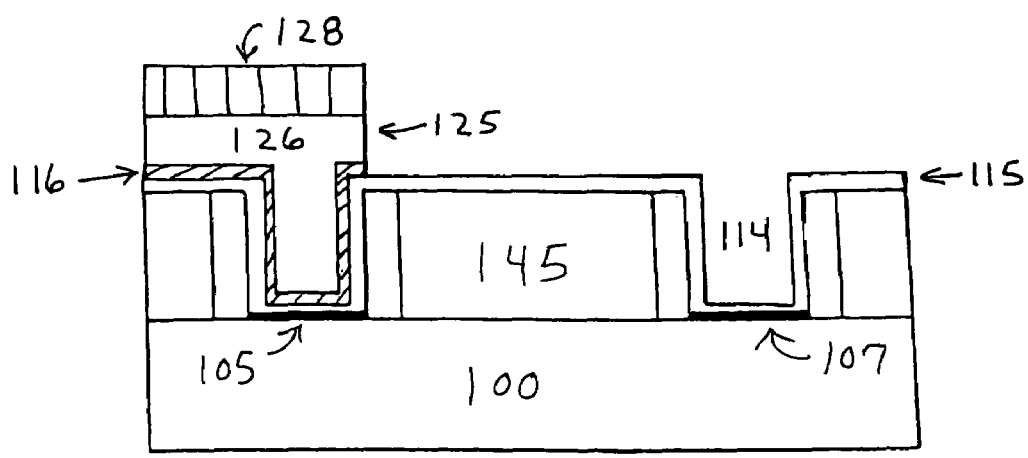
Figure 1N:
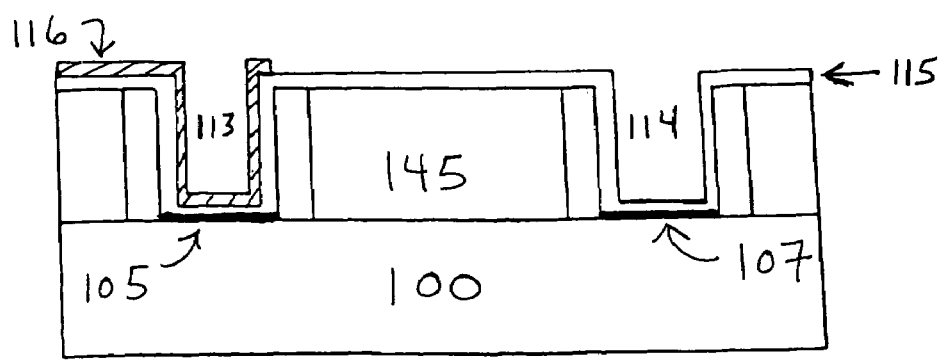
Figure 1O:
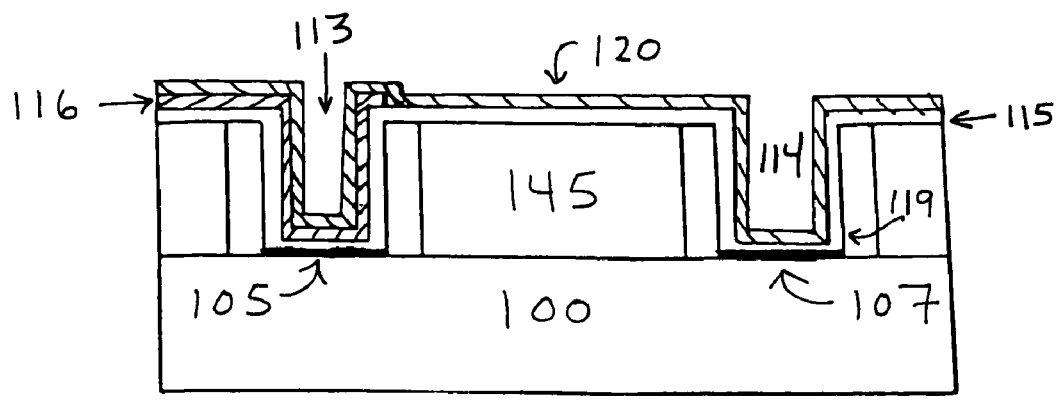
Figure 1P:
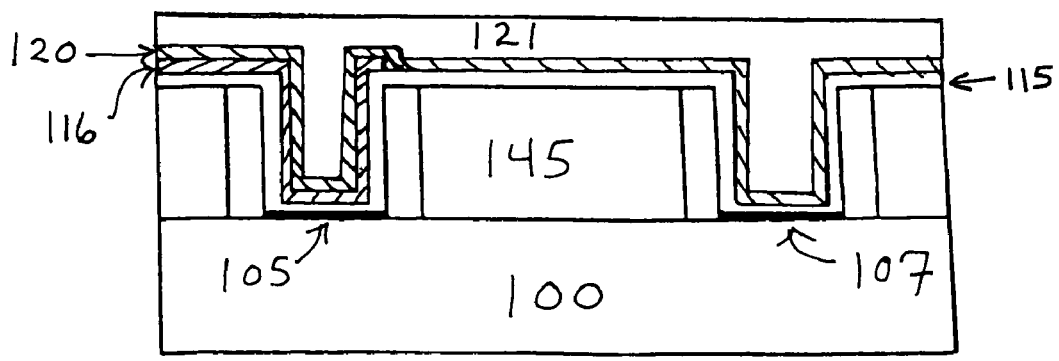
Figure 1Q:
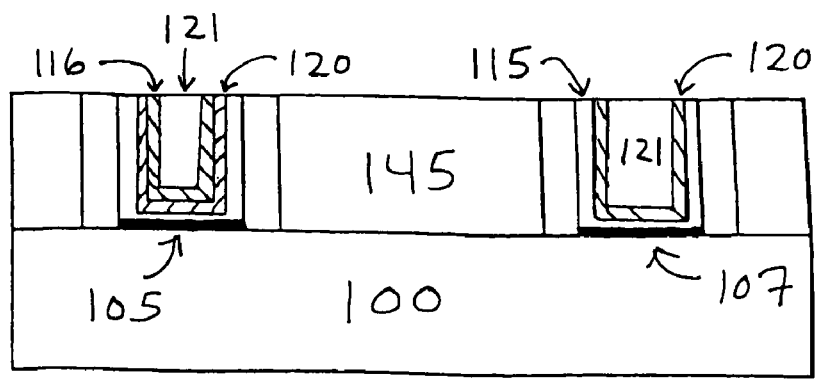

FIGS. 1a-1q illustrate structures that may be formed, when carrying out an embodiment of the method of the present invention. Initially, silicon dioxide layer 101 is thermally grown on substrate 100, as FIG. 1a illustrates. Substrate 100 may comprise any material that may serve as a foundation upon which a semiconductor device may be built. Substrate 100 may, for example, comprise silicon and/or germanium. Because silicon dioxide layer 101 preferably is no more than about three monolayers thick, that layer preferably is less than about 10 angstroms thick.

After forming silicon dioxide layer 101 on substrate 100, nitrogen is added to silicon dioxide layer 101. A sufficient amount of nitrogen should be added to layer 101 to generate an acceptably reliable film. A rapid thermal nitridation process may be used to add an appropriate amount of nitrogen to silicon dioxide layer 101 to form nitrided silicon dioxide layer 102, as FIG. 1b illustrates. In such a process, silicon dioxide layer 101 may be exposed to ammonia, which is present at a relatively low concentration in a nitrogen ambient, at a temperature of at least about 980° C. for a relatively short time period.

In one embodiment, substrate 100 is placed in a furnace that contains a gas mixture that comprises 0.07% ammonia in nitrogen. The furnace temperature may then be ramped up to between about 980° C. and about 1,080° C., e.g., at a rate of about 100° C. per second. After the furnace temperature reaches the desired level—preferably a temperature that is between about 1,000° C. and about 1,050° C. (e.g., 1,040° C.)—silicon dioxide layer 101 may be allowed to absorb nitrogen from the nitrogen/dilute ammonia ambient for about 15 seconds. Substrate 100—now covered with nitrided silicon dioxide layer 102—may then be removed from the furnace.

After converting silicon dioxide layer 101 into nitrided silicon dioxide layer 102, sacrificial layer 103 may be formed on nitrided silicon dioxide layer 102. Sacrificial layer 103 may comprise a substantially undoped polysilicon layer that has been deposited on nitrided silicon dioxide layer 102 using a conventional deposition process. When sacrificial layer 103 comprises polysilicon, it preferably is between about 100 and about 2,000 angstroms thick, and more preferably is between about 500 and about 1,100 angstroms thick.

After forming polysilicon containing layer 103, hard mask layer 130 may be formed on sacrificial layer 103 to generate the FIG. 1c structure. Hard mask layer 130 preferably comprises silicon nitride and preferably is formed using a conventional deposition process. In one embodiment, hard mask layer 130 is sufficiently thick to minimize any doping of polysilicon containing layer 103 during any subsequent ion implantation steps, e.g., ion implantation steps performed to create source and drain regions for the device. It may also be desirable to form a sufficiently thick hard mask layer to ensure that insignificant amounts of polysilicon containing layer 103 are converted into a silicide, when source and drain regions are silicided. Although hard mask layer 130 may be between about 100 and about 1,000 angstroms thick, that layer preferably is between about 800 and about 1,000 angstroms thick—when it comprises silicon nitride—to protect polysilicon containing layer 103 during subsequent ion implantation and silicidation steps.

After hard mask layer 130 is formed, it may be desirable to perform an anneal step to render hard mask layer 130 less susceptible to shrinkage, when subsequently formed source and drain regions are subjected to a high temperature anneal. By increasing hard mask layer 130's resistance to shrinkage during a subsequent high temperature anneal, that layer may retain its ability to protect polysilicon containing layer 103 during any silicidation step that follows such a high temperature anneal.

When hard mask layer 130 comprises silicon nitride, it may be annealed at about 600° C. in a nitrogen ambient. In one embodiment, after the FIG. 1c structure is placed in a furnace, the temperature may be ramped up to about 600° C. at a rate of about 75° C. per second. After reaching that temperature, the device may be annealed for between about 30 seconds and about 5 minutes (e.g., for about 2 minutes) before being removed from the furnace.

Although in a preferred embodiment, hard mask layer 130 should be sufficiently thick to protect polysilicon containing layer 103 during subsequent ion implantation and silicidation steps, in alternative embodiments an etch stop layer (not shown here) may be formed on hard mask layer 130 to help protect layer 103. Such an etch stop layer may comprise, for example, silicon oxynitride.

When hard mask layer 130 comprises silicon nitride, that layer may be patterned to form hard masks 135 and 140 using a dry etch process that is selective for layer 130 over polysilicon containing layer 103. Polysilicon containing layer 103 may then be patterned to form patterned polysilicon containing layers 104 and 106 using a dry etch process that is selective for layer 103 over nitrided silicon dioxide layer 102. After forming hard masks 135 and 140 and patterned polysilicon containing layers 104 and 106, the exposed part of nitrided silicon dioxide layer 102 may be removed to generate patterned nitrided silicon dioxide layers 105 and 107—as shown in FIG. 1d. In a preferred embodiment, a conventional wet etch process may be used to form patterned nitrided silicon dioxide layers 105 and 107—although a dry etch process may also be used.

After forming the FIG. 1d structure, spacers are formed on opposite sides of patterned polysilicon containing layers 104 and 106 and patterned nitrided silicon dioxide layers 105 and 107. When those spacers comprise silicon nitride, they may be formed in the following way. First, a silicon nitride layer of substantially uniform thickness—preferably less than about 1,000 angstroms thick—is deposited over the entire structure, producing the structure shown in FIG. 1e. Conventional deposition processes may be used to generate that structure.

Silicon nitride layer 108 may be anisotropically etched using a conventional process to create the FIG. 1f structure. As a result of that etch step, first and second spacers 109 and 110 are formed on opposite sides of first patterned polysilicon containing layer 104 and first patterned nitrided silicon dioxide layer 105. At the same time, third and fourth spacers 111 and 112 are formed on opposite sides of second patterned polysilicon containing layer 106 and second patterned nitrided silicon dioxide layer 107. If hard masks 135 and 140 comprise silicon nitride, it may be necessary to limit the duration of this anisotropic etch step to ensure that significant parts of those hard masks are not removed. Alternatively, etch stop layers (not shown) may be formed on the hard masks (as suggested above) to prevent this anisotropic etch step from removing significant parts of the hard masks, when silicon nitride layer 108 is etched.

After forming spacers 109, 110, 111, and 112, dielectric layer 145 may be deposited over the device, generating the FIG. 1g structure. Dielectric layer 145 may comprise silicon dioxide, or a low-k material. Dielectric layer 145, and hard masks 135 and 140, may then be removed from patterned polysilicon containing layers 104 and 106 to produce the FIG. 1h structure. A conventional chemical mechanical polishing ("CMP") step, or steps, may be applied to remove that part of dielectric layer 145 and to remove hard masks 135 and 140. At this point, the hard masks may be removed as they will have served their function by this stage in the process. Although not shown, the FIG. 1h structure may include many other features (e.g., a silicon nitride etch stop layer, silicided source and drain regions, and one or more buffer layers) that may be formed using conventional processes.

After forming the FIG. 1h structure, patterned polysilicon containing layers 104 and 106 are removed. In this embodiment, a wet etch process is applied to simultaneously remove those layers. Such a wet etch process may comprise exposing layers 104 and 106 to an aqueous solution that comprises a source of hydroxide for a sufficient time at a sufficient temperature to remove substantially all of those layers. That source of hydroxide may comprise between about 0.1 percent and about 10 percent ammonium hydroxide or tetraethyl ammonium hydroxide by volume in deionized water.

In one embodiment, patterned polysilicon containing layers 104 and 106 may be removed by exposing them to a solution, which is maintained at a temperature between about 20° C. and about 30° C., that comprises between about 0.1 percent and about 5 percent ammonium hydroxide by volume in deionized water. During that exposure step, which preferably lasts at least one minute, it may be desirable to apply sonic energy at a frequency of between about 700 KHz and about 1,000 KHz, while dissipating at between about 3 and about 8 watts/cm². For example, if layers 104 and 106 are each about 800 angstroms thick, they may be removed by exposing them at about 24° C. for about 5 minutes to a solution that comprises about 1 percent ammonium hydroxide by volume in deionized water, while applying sonic energy at about 750 KHz—dissipating at about 5 watts/cm².

This wet etch process should remove substantially all of patterned polysilicon containing layers 104 and 106 as long as hard masks 135 and 140 (or the combination of those hard masks and overlying etch stop layers) ensure that the boron concentration in either layer 104 or layer 106 is no greater than about $1.0 \times e^{17}$ atoms/cm³.

In another embodiment, patterned polysilicon containing layers 104 and 106 may be removed by exposing them to a solution that comprises between about 2 percent and about 10 percent tetraethyl ammonium hydroxide by volume in deionized water for at least about 10 minutes. For example, if layers 104 and 106 are each about 800 angstroms thick, they may be removed by exposing them at about 24° C. for about 10 minutes to a solution that comprises about 5 percent tetraethyl ammonium hydroxide by volume in deionized water. In this embodiment, it may not be necessary to apply sonic energy to help remove layers 104 and 106. This wet etch process should remove substantially all of patterned polysilicon containing layers 104 and 106 as long as hard masks 135 and 140 (or their combination with overlying etch stop layers) ensure that the concentration of any n-type or p-type dopant in either layer 104 or layer 106 is no greater than about $1.0 \times e^{17}$ atoms/cm³.

As shown in FIG. 1i, removal of patterned polysilicon containing layers 104 and 106 forms trenches 113 and 114 within dielectric layer 145—positioned between first and second spacers 109 and 110, and between third and fourth spacers 111 and 112, respectively. After removing layers 104 and 106, high-k gate dielectric layer 115 is formed within trenches 113 and 114 and on patterned nitrided silicon dioxide layers 105 and 107, as figure 1*j* illustrates. High-k gate dielectric layer 115 may comprise, for example, hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, lanthanum oxide, zirconium oxide, and aluminum oxide. Although a few examples of materials that may be used to form high-k gate dielectric layer 115 are described here, that layer may be made from other materials that serve to reduce gate leakage.

High-k gate dielectric layer 115 may be formed on patterned nitrided silicon dioxide layers 105 and 107 using a conventional atomic layer chemical vapor deposition ("ALCVD") process. In such a process, a metal oxide precursor (e.g., a metal chloride) and steam may be alternately fed at selected flow rates into a CVD reactor, which is operated at a selected pressure while substrate 100 is maintained at a selected temperature. The CVD reactor should be operated long enough to form a layer with the desired thickness. In most applications, high-k gate dielectric layer 115 should be less than about 40 angstroms thick, and more preferably between about 5 angstroms and about 20 angstroms thick. As shown in FIG. 1*j*, when an ALCVD process is used to form high-k gate dielectric layer 115, that layer will form on the sides of trenches 113 and 114 in addition to forming on the bottom of those trenches, and will form on dielectric layer 145.

After forming high-k gate dielectric layer 115, first metal layer 116 may be formed on dielectric layer 115, as shown in FIG. 1*k*. In this embodiment, first metal layer 116 comprises a p-type metal layer, which may comprise any conductive material from which a metal PMOS gate electrode may be derived. P-type materials that may be used to form p-type metal layer 116 include ruthenium, palladium, platinum, cobalt, nickel, and conductive metal oxides, e.g., ruthenium oxide. P-type metal layer 116 preferably has a workfunction that is between about 4.9 eV and about 5.2 eV, and may be formed on high-k gate dielectric layer 115 using well known physical vapor deposition ("PVD") or CVD processes.

P-type metal layer 116 should be thick enough to ensure that any material formed on it will not significantly impact its workfunction. For that reason, p-type metal layer 116 preferably should be between about 25 angstroms and about 300 angstroms thick, and more preferably should be between about 50 angstroms and about 100 angstroms thick. Although a few examples of materials that may be used to form p-type metal layer 116 are described here, that layer may be made from many other materials. For example, p-type metal layer 116 may comprise a metal carbide layer, e.g., a titanium carbide layer that includes a relatively high concentration of nitrogen. Like high-k gate dielectric layer 115, in this embodiment part of p-type metal layer 116 lines trenches 113 and 114 while part of that layer spills over onto dielectric layer 145.

After forming p-type metal layer 116 on high-k gate dielectric layer 115, masking layer 125 may be deposited onto p-type metal layer 116, filling trenches 113 and 114. Masking layer 125 may comprise a spin-on-glass ("SOG") material, which is used to mask a first part of p-type metal layer 116 prior to etching a second part of that metal layer. As shown in FIG. 1*l*, first part 126 of SOG layer 125 covers first part 118 of high-k gate dielectric layer 115, while second part 127 of SOG layer 125 covers second part 119 of high-k gate dielectric layer 115. Mask 128 (e.g., a patterned layer of photoresist) covers first part 126 of SOG layer 125. SOG layer 125 may be deposited onto p-type metal layer 116, and mask 128 may be generated, using conventional processes, as will be apparent to those skilled in the art.

Second part 127 of SOG layer 125 is then removed, while first part 126 of SOG layer 125 is retained. A conventional SOG etch process may be used to remove second part 127. That removal step exposes part 129 of p-type metal layer 116. Exposed part 129 of p-type metal layer 116 is then removed, as FIG. 1*m* illustrates. After removing exposed part 129, mask 128 and first part 126 of SOG layer 125, the FIG. 1*n* structure results. Conventional process steps may be used to remove exposed part 129, mask 128, and first part 126—as will be apparent to those skilled in the art.

Applying an SOG material as the masking material in the method of the present invention may be beneficial for at least the following reasons. Such an SOG material may fill narrow trenches that other materials, e.g., photoresist, may not adequately fill. In addition, conventional etch processes for removing SOG materials may effectively remove such materials without removing a significant part of the underlying p-type metal layer.

After etching p-type metal layer 116, second metal layer 120 may be deposited on p-type metal layer 116, as shown in FIG. 1*o*. In this embodiment, second metal layer 120 comprises an n-type metal layer, which may comprise any conductive material from which a metal NMOS gate electrode may be derived. N-type materials that may be used to form n-type metal layer 120 include hafnium, zirconium, titanium, tantalum, aluminum, and metal carbides that include these elements, i.e., titanium carbide, zirconium carbide, tantalum carbide, hafnium carbide and aluminum carbide. N-type metal layer 120 may alternatively comprise an aluminide, e.g., an aluminide that comprises hafnium, zirconium, titanium, tantalum, or tungsten.

N-type metal layer 120 preferably has a workfunction that is between about 3.9 eV and about 4.2 eV, and may be formed on second part 119 of high-k gate dielectric layer 115, and on the remaining part of p-type metal layer 116, using well known PVD or CVD processes. Like p-type metal layer 116, n-type metal layer 120 should be thick enough to ensure that any material formed on it will not significantly impact its workfunction. Also like p-type metal layer 116, n-type metal layer 120 preferably should be between about 25 angstroms and about 300 angstroms thick, and more preferably should be between about 50 angstroms and about 100 angstroms thick.

In this embodiment, after forming n-type metal layer 120 on second part 119 of high-k gate dielectric layer 115, and on the remaining part of p-type metal layer 116, fill metal 121 is formed on n-type metal layer 120. Fill metal 121 fills the remainder of trenches 113 and 114, and covers dielectric layer 145, as illustrated in FIG. 1*p*. Fill metal 121 preferably comprises a material that may be easily polished, and preferably is deposited over the entire device using a conventional metal deposition process. Such a fill metal may comprise, for example, titanium nitride, tungsten, titanium, aluminum, tantalum, tantalum nitride, cobalt, copper, or nickel. In a particularly preferred embodiment, fill metal 121 comprises titanium nitride. Titanium nitride may be deposited using an appropriate CVD or PVD process that does not significantly affect underlying n-type metal layer 120, or the underlying p-type metal and dielectric layers.

After forming the FIG. 1*p* structure, fill metal 121, n-type metal layer 120, p-type metal layer 116, and high-k gate dielectric layer 115 are removed from above dielectric layer 145 to generate the FIG. 1q structure. An appropriate CMP or etch process may be used to remove those layers from dielectric layer 145. In a preferred embodiment, a combination of CMP and etch processes are used, e.g., a CMP step to remove fill metal 121 followed by an etch step (or steps) to remove n-type metal layer 120, p-type metal layer 116, and high-k gate dielectric layer 115. In this embodiment, the resulting device includes a metal PMOS gate electrode and a metal NMOS gate electrode.

After removing fill metal 121, n-type metal layer 120, p-type metal layer 116, and high-k gate dielectric layer 115 from above dielectric layer 145, a capping dielectric layer (not shown) may be deposited onto the resulting structure using a conventional deposition process. Process steps for completing the device that follow the deposition of such a capping dielectric layer, e.g., forming the device's contacts, metal interconnect, and passivation layer, are well known to those skilled in the art and will not be described here.

The method of the present invention may enable one to use a replacement gate process to make a semiconductor device that includes a high-k gate dielectric and metal gate electrodes, which is reliable and provides high performance. Although the foregoing description has specified certain steps and materials that may be used in the method of the present invention, those skilled in the art will appreciate that many modifications and substitutions may be made. Accordingly, all such modifications, substitutions and additions fall within the spirit and scope of the invention as defined by the appended claims.

What is claimed is:

1. A method for making a semiconductor device comprising:
   forming a silicon dioxide layer on a substrate;
   adding nitrogen to the silicon dioxide layer to form a nitrided silicon dioxide layer;
   forming a sacrificial layer on the nitrided silicon dioxide layer;
   forming a pair of spacers on opposite sides of the nitrided silicon dioxide layer;
   removing the sacrificial layer to generate a trench between the pair of spacers;
   forming a high-k gate dielectric layer on the nitrided silicon dioxide layer and within the trench; and
   forming a metal gate electrode on the high-k gate dielectric layer.

2. The method of claim 1 wherein the high-k gate dielectric layer comprises a material that is selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

3. The method of claim 1 wherein a rapid thermal nitridation process is applied to form the nitrided silicon dioxide layer, the rapid thermal nitridation process comprising exposing the silicon dioxide layer to ammonia at a temperature of at least about 980° C.

4. The method of claim 1 wherein:
   the nitrided silicon dioxide layer is less than about 10 angstroms thick;
   the sacrificial layer is between about 500 angstroms and about 1,100 angstroms thick and comprises polysilicon;
   the sacrificial layer is removed by exposing it to an aqueous solution that comprises a source of hydroxide; and
   the high-k gate dielectric layer is between about 5 angstroms and about 20 angstroms thick.

5. The method of claim 1 wherein the metal gate electrode comprises a material that is selected from the group consisting of hafnium, zirconium, titanium, tantalum, aluminum, a metal carbide, an aluminide, ruthenium, palladium, platinum, cobalt, nickel, and a conductive metal oxide.

6. A method for making a semiconductor device comprising:
   forming a silicon dioxide layer on a substrate;
   adding nitrogen to the silicon dioxide layer to form a nitrided silicon dioxide layer;
   forming a polysilicon containing layer on the nitrided silicon dioxide layer;
   forming a hard mask layer on the polysilicon containing layer;
   etching the hard mask layer, the polysilicon containing layer and the nitrided silicon dioxide layer to form a hard mask that covers a patterned polysilicon containing layer and a patterned nitrided silicon dioxide layer;
   forming first and second spacers on opposite sides of the patterned polysilicon containing layer and the patterned nitrided silicon dioxide layer;
   exposing the patterned polysilicon containing layer to an aqueous solution that comprises a source of hydroxide to remove the patterned polysilicon containing layer, while retaining the patterned nitrided silicon dioxide layer, and to generate a trench that is positioned between the first and second spacers;
   forming a high-k gate dielectric layer on the patterned nitrided silicon dioxide layer and within the trench; and
   forming a metal gate electrode on the high-k gate dielectric layer.

7. The method of claim 6 wherein:
   the nitrided silicon dioxide layer is less than about 10 angstroms thick;
   the polysilicon containing layer is between about 500 angstroms and about 1,100 angstroms thick; and
   the high-k gate dielectric layer is between about 5 angstroms and about 20 angstroms thick.

8. The method of claim 6 wherein:
   the high-k gate dielectric layer comprises a material that is selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate; and
   the metal gate electrode comprises a metal layer that comprises a material that is selected from the group consisting of hafnium, zirconium, titanium, tantalum, aluminum, a metal carbide, an aluminide, ruthenium, palladium, platinum, cobalt, nickel, and a conductive metal oxide.

9. The method of claim 8 wherein the metal layer comprises a material that is selected from the group consisting of hafnium, zirconium, titanium, tantalum, aluminum, a metal carbide, and an aluminide, and has a workfunction that is between about 3.9 eV and about 4.2 eV.

10. The method of claim 8 wherein the metal layer comprises a material that is selected from the group consisting of ruthenium, palladium, platinum, cobalt, nickel, and a conductive metal oxide, and has a workfunction that is between about 4.9 eV and about 5.2 eV.

11. A method for making a semiconductor device comprising:

forming a silicon dioxide layer on a substrate;
adding nitrogen to the silicon dioxide layer to form a nitrided silicon dioxide layer;
forming a polysilicon containing layer on the nitrided silicon dioxide layer;
forming a silicon nitride containing layer on the polysilicon containing layer;
etching the silicon nitride containing layer, the polysilicon containing layer and the nitrided silicon dioxide layer to form first and second silicon nitride containing hard masks that cover first and second patterned polysilicon containing layers and first and second patterned nitrided silicon dioxide layers;
forming first and second spacers on opposite sides of the first patterned polysilicon containing layer and the first patterned nitrided silicon dioxide layer, and forming third and fourth spacers on opposite sides of the second patterned polysilicon containing layer and the second patterned nitrided silicon dioxide layer;
removing the first and second silicon nitride containing hard masks from the first and second patterned polysilicon containing layers;
exposing the first and second patterned polysilicon containing layers to an aqueous solution that comprises a source of hydroxide to remove the first and second patterned polysilicon containing layers, while retaining the first and second patterned nitrided silicon dioxide layers, and to generate a first trench that is positioned between the first and second spacers and a second trench that is positioned between the third and fourth spacers;
forming a high-k gate dielectric layer on the first and second nitrided silicon dioxide layers and within the first and second trenches;
forming a metal layer on the high-k gate dielectric layer;
forming a masking layer on the metal layer, a first part of the masking layer covering a first part of the high-k gate dielectric layer and a second part of the masking layer covering a second part of the high-k gate dielectric layer;
removing the second part of the masking layer while retaining the first part of the masking layer, exposing part of the metal layer;
removing the exposed part of the metal layer to generate a first metal layer that covers the first part of the high-k gate dielectric layer but does not cover the second part of the high-k gate dielectric layer;
removing the first part of the masking layer; and
forming a second metal layer on the first metal layer and on the second part of the high-k gate dielectric layer, the second metal layer covering the first metal layer and covering the second part of the high-k gate dielectric layer.

12. The method of claim 11 wherein the high-k gate dielectric layer is between about 5 angstroms and about 20 angstroms thick and comprises a material that is selected from the group consisting of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

13. The method of claim 11 wherein:
the first metal layer comprises a metal that is selected from the group consisting of ruthenium, palladium, platinum, cobalt, nickel, and a conductive metal oxide, and has a workfunction that is between about 4.9 eV and about 5.2 eV; and
the second metal gate electrode comprises a metal that is selected from the group consisting of hafnium, zirconium, titanium, tantalum, aluminum, a metal carbide, and an aluminide, and has a workfunction that is between about 3.9 eV and about 4.2 eV.

14. The method of claim 11 wherein the first metal layer comprises a p-type metal layer that is between about 50 angstroms and about 100 angstroms thick, and the second metal layer comprises an n-type metal layer that is between about 50 angstroms and about 100 angstroms thick, and further comprising forming a fill metal on the n-type metal layer.

15. The method of claim 14 wherein the fill metal is selected from the group consisting of titanium nitride, tungsten, titanium, aluminum, tantalum, tantalum nitride, cobalt, copper, and nickel.

16. The method of claim 11 wherein a rapid thermal nitridation process is applied to form the nitrided silicon dioxide layer, the rapid thermal nitridation process comprising exposing the silicon dioxide layer to ammonia at a temperature of at least about 980° C.

17. The method of claim 11 wherein the silicon nitride containing layer is between about 800 angstroms and about 1,000 angstroms thick, and the masking layer comprises a spin-on-glass.

18. The method of claim 11 wherein the first and second patterned polysilicon containing layers are removed by exposing the first and second patterned polysilicon containing layers to an aqueous solution that comprises between about 0.1 percent and about 10 percent by volume of a source of hydroxide that is selected from the group consisting of ammonium hydroxide and tetraethyl ammonium hydroxide.

19. The method of claim 18 wherein the first and second patterned polysilicon containing layers are exposed to the aqueous solution at a temperature that is between about 20° C. and about 30° C., the aqueous solution comprising between about 0.1 percent and about 5 percent ammonium hydroxide by volume in deionized water, and wherein sonic energy is applied while the first and second patterned polysilicon containing layers are exposed to the aqueous solution at a frequency of between about 700 KHz and about 1,000 KHz, while dissipating at between about 3 and about 8 watts/cm$^2$.

20. The method of claim 18 wherein the first and second patterned polysilicon containing layers are exposed to the aqueous solution for at least about 10 minutes at a temperature that is between about 20° C. and about 30° C., the aqueous solution comprising between about 2 percent and about 10 percent tetraethyl ammonium hydroxide by volume in deionized water.

* * * * *